United States Patent
Bazes

(10) Patent No.: US 7,839,220 B2
(45) Date of Patent: Nov. 23, 2010

(54) PHASE-LOCKED LOOP RUNAWAY DETECTOR

(75) Inventor: Mel Bazes, Haifa (IL)

(73) Assignee: Marvell Israel (M. I. S. L.) Ltd., Yokneam (IL)

( * ) Notice: Subject to any disclaimer, the term of this patent is extended or adjusted under 35 U.S.C. 154(b) by 95 days.

(21) Appl. No.: 11/743,604

(22) Filed: May 2, 2007

(65) Prior Publication Data

US 2008/0036543 A1 Feb. 14, 2008

Related U.S. Application Data

(60) Provisional application No. 60/822,013, filed on Aug. 10, 2006.

(51) Int. Cl.
*H03L 7/00* (2006.01)

(52) U.S. Cl. ............... 331/16; 331/8; 331/11; 331/14; 331/17; 331/25; 331/34; 327/155; 375/376

(58) Field of Classification Search ......... 327/3, 327/5, 7, 145, 155; 331/1 A, 8, 10, 11, 14, 331/15, 17, 18, 23, 25, 34, 48, 49; 375/376
See application file for complete search history.

(56) References Cited

U.S. PATENT DOCUMENTS

| | | | | |
|---|---|---|---|---|
| 5,257,294 A | * | 10/1993 | Pinto et al. ............. | 375/376 |
| 5,471,176 A | * | 11/1995 | Henson et al. .......... | 331/1 A |
| 5,572,167 A | * | 11/1996 | Alder et al. ............. | 331/2 |
| 5,694,087 A | | 12/1997 | Ferraiolo et al. | |
| 5,864,572 A | | 1/1999 | Bhagwan | |
| 6,140,880 A | * | 10/2000 | Moyal et al. ............ | 331/1 A |
| 6,369,660 B1 | * | 4/2002 | Wei et al. ............... | 331/15 |
| 6,590,426 B2 | * | 7/2003 | Perrott ................... | 327/7 |
| 6,782,068 B1 | | 8/2004 | Wilson et al. | |
| 6,853,254 B2 | * | 2/2005 | Li ........................ | 331/16 |
| 6,891,443 B2 | * | 5/2005 | Rashid ................... | 331/111 |
| 6,919,769 B2 | * | 7/2005 | Lim et al. .............. | 331/17 |
| 7,123,065 B1 | * | 10/2006 | Moyal .................. | 327/156 |
| 2003/0042985 A1 | * | 3/2003 | Shibahara et al. ....... | 331/17 |
| 2006/0226916 A1 | * | 10/2006 | Florescu et al. ......... | 331/16 |
| 2007/0002993 A1 | * | 1/2007 | Wang et al. ............ | 375/374 |
| 2007/0216488 A1 | * | 9/2007 | Kultgen ................. | 331/16 |

* cited by examiner

*Primary Examiner*—Arnold Kinkead
*Assistant Examiner*—Richard Tan

(57) ABSTRACT

In a circuit having a runaway detector coupled to a phase-locked loop (PLL), the PLL may include a loop filter to receive a control voltage within the PLL and provide a filtered control voltage and a voltage-controlled oscillator to receive the filtered control voltage and provide an output clock signal. The runaway detector may provide a control signal for adjusting the filtered control voltage in response to a predetermined PLL condition. The runaway detector may include a comparator to receive a first and second input voltages, where the second input voltage is based on the output clock signal. When the predetermined PLL condition exists, the runaway detector may be active to adjust the filtered control voltage, thereby enabling the PLL to return to a lock condition.

28 Claims, 15 Drawing Sheets

PHASE-LOCKED LOOP RUNAWAY DETECTOR

CROSS REFERENCE TO RELATED APPLICATIONS

The present application claims the benefit of U.S. provisional application Ser. No. 60/822,013, filed on Aug. 10, 2006, the disclosure of which is incorporated herein by reference in its entirety.

BACKGROUND OF THE INVENTION

1. Field of the Invention

This invention relates generally to a phase-locked loop (PLL), and more particularly to a phase-locked loop runaway detector.

2. Description of the Related Art

A phase-locked lop (PLL) is a closed-loop feedback control system that generates and outputs a signal in relation to the frequency and phase of an input signal. The PLL responds to both the frequency and phase of the input signal and automatically raises or lowers the frequency of a controlled oscillator until it matches the input signal in both frequency and phase.

FIG. 1 illustrates a block diagram of a known phase-locked loop (PLL). The PLL in FIG. 1 includes a phase-frequency detector (PFD) 110, a charge pump 125, a loop filter 130, a voltage controlled oscillator (VCO) 140, and a divider 145. The PFD 110 receives an input clock CK1 105 and a feedback signal CKF 155 from the divider 145. The PFD 110 will output either an UP 115 or a DOWN 120 signal to the charge pump 125 depending on the difference in frequency between the input clock CKI 105 and the feedback signal CKF 155. Based on the UP 115 or DOWN 120 signal provided to the charge pump 125, the charge pump 125 outputs a charge pump voltage signal VCP 160 to the loop filter 130. The loop filter 130 may filter the charge pump voltage signal VCP 160 to eliminate noise or distortion before passing the control voltage signal VDTRL 135 to the VCO 140. Based on the control voltage signal VCTRL 135, the VCO 140 may increase or decrease the frequency of the VCO output 150.

The PLL generally operates in a steady-state (locked) or transient (unlocked) condition. When the PLL is in steady-state operation (i.e. locked), the output of the VCO 140, identified in FIG. 1 as the PLL output clock CKO 150, has a frequency N times higher than the frequency of the input, or reference, clock CKI 105. The multiple N is the divisor of the divider 145. Thus, in lock, the feedback signal CKF 155 input to the PFD 110 from the divider 145 should have exactly the same frequency as the input clock CKI 105.

Generally, the PLL may be in a transient state (i.e. unlocked) when the PLL is powering up and beginning to become locked. The PLL also may operate in a transient state if a disturbance, such as a supply glitch or other nose, causes the PLL to lose lock. In an unlocked state, the PLL output clock CKO 150 may have any value, either above or below the PLL lock frequency. To attempt to bring the PLL into a locked state, the PLL may change the VCO output frequency in a direction that will bring the PLL into lock. However, if the VCO output frequency is so high that the divider 145 fails to respond to it correctly, the PLL loop will malfunction, and the divider 145 will output either a corrupted signal or no signal at all. In this situation, the PFD 110 may see signal transitions at the CKI 105 input, but few or no transitions at the input CKF 155 from the divider 145. The PFD 110 may mistakenly interpret this situation to be one in which the VCO output frequency is too low instead of too high. Consequently, instead of activating the DOWN 120 signal to the charge pump 125 to decrease the VCO frequency, the PFD 110 may actually activate the UP 115 signal to the charge pump 125, causing the VCO frequency to increase further until it plateaus at the maximum possible operating frequency. This phenomenon, in which the VCO frequency increases unrestrained to its maximum possible value, is referred to as runaway.

Therefore, it would be desirable to have an apparatus that can detect a PLL runaway condition and force the PLL to return to a locked state.

SUMMARY OF THE INVENTION

To address the states need and fulfill other desired objectives, in accordance with one embodiment of the invention, a circuit includes a runaway detector coupled to a phase-locked loop (PLL). The phase-locked loop may include a loop filter to receive a control voltage within the PLL and provide a filtered control voltage and a voltage-controlled oscillator to receive the filtered control voltage and provide an output clock signal. The runaway detector may provide a discharge control signal for reducing the filtered control voltage in response to a predetermined PLL condition. The runaway detector may include a comparator to receive a first and a second input voltage, where the second input voltage is based on the output clock signal. When the predetermined PLL condition exists, the runaway detector may be active to reduce the filtered control voltage, thereby enabling the PLL to return to a lock condition.

DETAILED DESCRIPTION OF EMBODIMENTS

Figure 1:
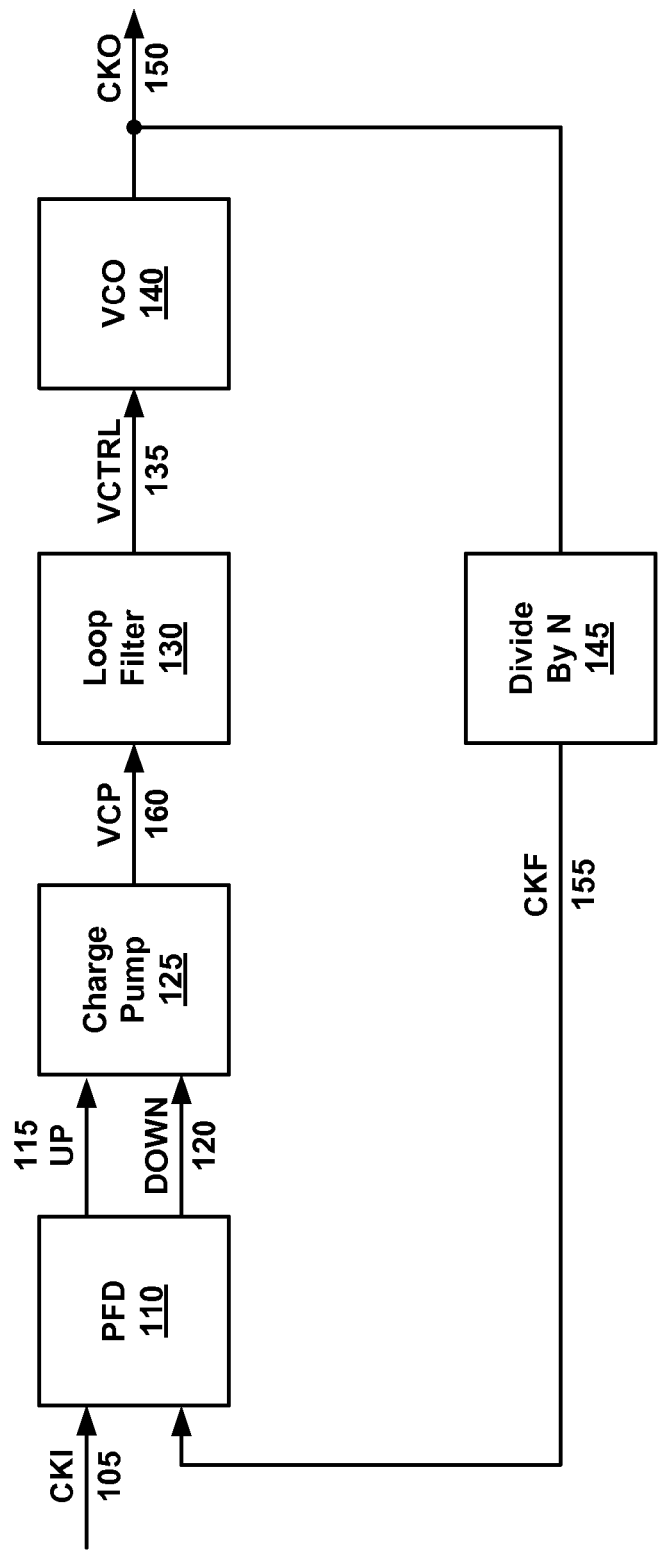
FIG. 1 illustrates a block diagram of a know phase-locked loop (PLL).
Figure 2:
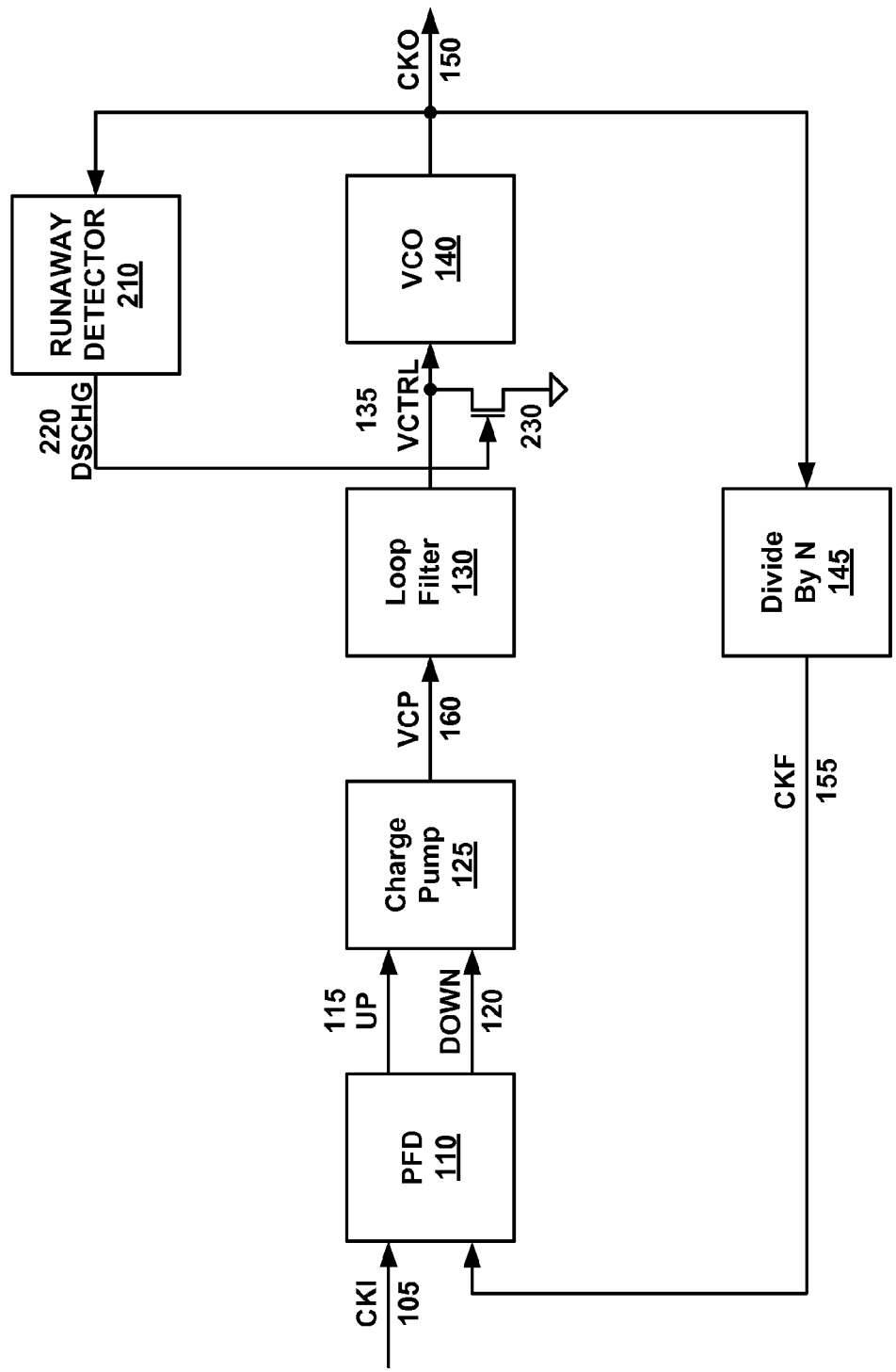
FIG. 2 illustrates a block diagram of one embodiment of a PLL with a runaway detector in accordance with one aspect of the present invention.

FIG. 2 illustrates a block diagram of one embodiment of a phase locked loop (PLL) with a runaway detector. As in the PLL of FIG. 1, the PLL of FIG. 2 includes a phase-frequency detector (PFD) 110, a charge pump 125, a loop filter 130, a voltage-controlled oscillator (VCO) 140, and a divider 145. As shown in FIG. 2, a runaway detector 210 is coupled to the output of the VCO 140 to receive the output clock signal CKO 150. The runaway detector 210 also may be coupled to the output of the loop filter 130. Based on the output clock signal CKO 150, the runaway detector 210 outputs a discharge control signal DSCHG 220 which may cause a component 230, which in one embodiment may be a transistor or an N-type transistor, coupled to both the output of the loop filter and ground, to lower the filtered control voltage VCTRL 135, thereby preventing or halting the PLL from entering into or remaining in a runaway condition.

Figure 3:
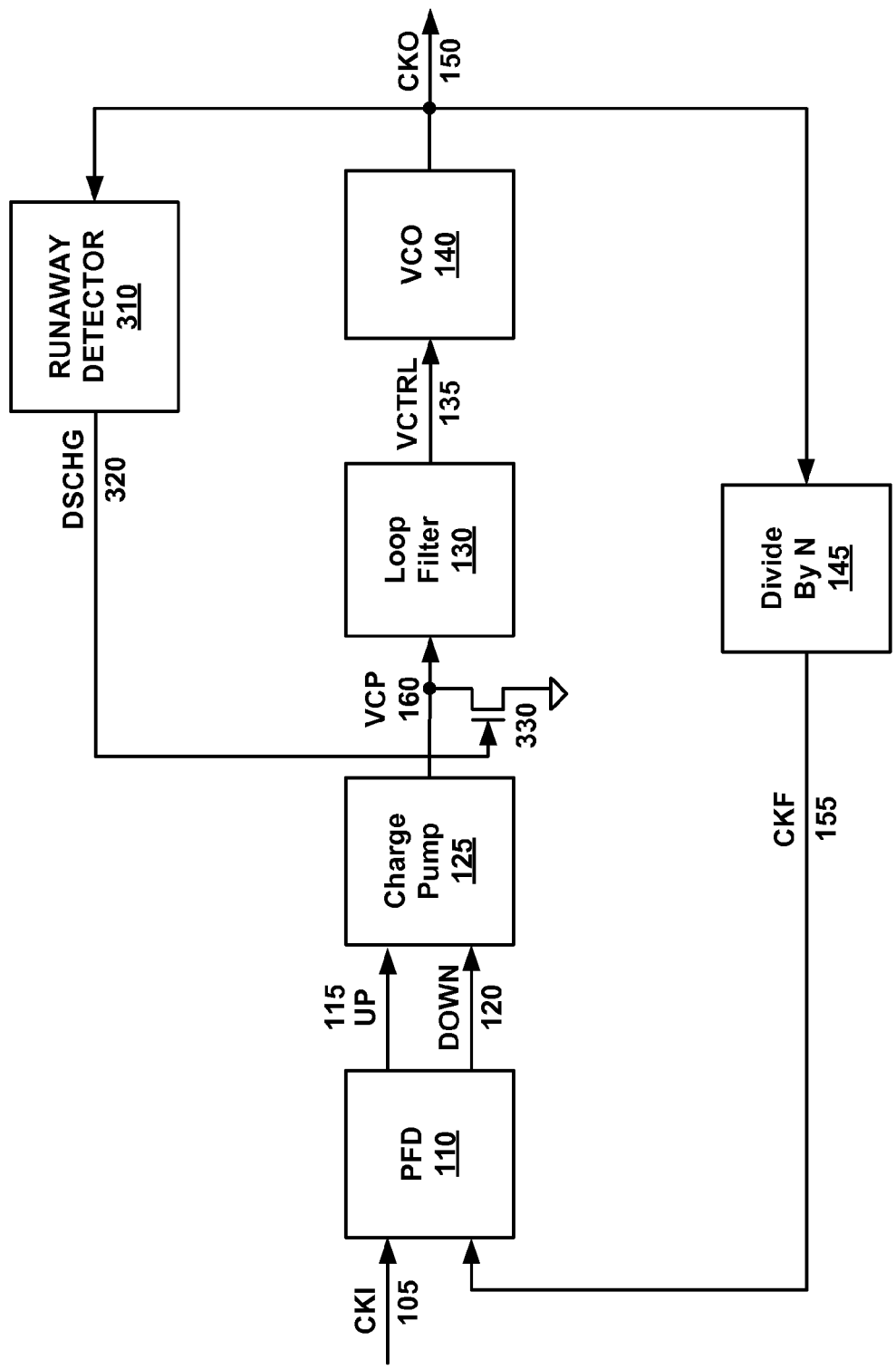
FIG. 3 illustrates a block diagram of another embodiment of a PLL with a runaway detector in accordance with one aspect of the present invention.

FIG. 3 illustrates a block diagram of another embodiment of a phase-locked loop (PLL) with a runaway detector. FIG. 3 shows the same elements as FIG. 2, but in FIG. 3, the runaway detector 310 may be coupled to the output of the charge pump VCP 160 rather than to the output of the loop filter 130. The runaway detector 310 otherwise operates in a manner similar to that of the runaway detector 210 in the FIG. 2 embodiment. The detector 310 may receive the output clock signal CKO 150 from the voltage-controlled oscillator (VCO) 140, and may output a discharge control signal DSCHG 320. A component 330, which may be a transistor or an N-type transistor, may receive the discharge control signal DSCHG 320. The component 330 may be coupled between the output of the charge pump VCP 160 and ground. The value of DSCHG 320 may vary depending on whether the output clock signal CKO 150 exceeds a certain predetermined frequency, indicating that the PLL may be in a runaway condition. If the detector 310 detects a runaway condition, the component 330 may reduce the charge pump voltage provided by the charge pump 125. This reduction may result in a lowering of the frequency of the output clock signal CKO 150 provided by the VCO 140, thereby preventing or halting the PLL from entering into or remaining in a runaway state. Coupling the component 330 and the runaway detector 310 to the output of the charge pump VCP 160 may enable any noise produced by the component 330 to be filtered by the loop filter 130.

Figure 4:
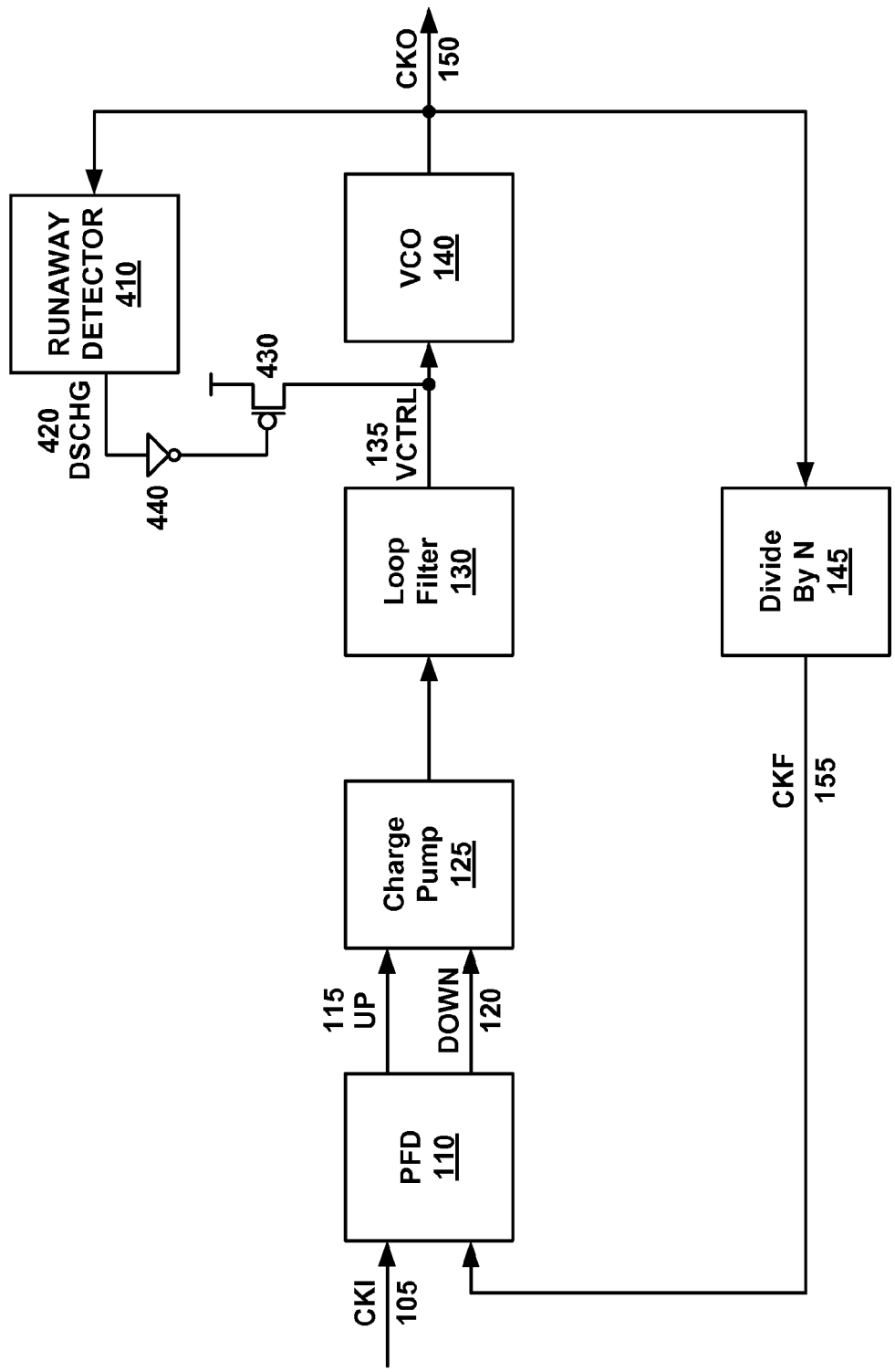
FIG. 4 illustrates a block diagram of another embodiment of a PLL with a runaway detector.

FIG. 4 illustrates a block diagram of another embodiment of a phase-locked loop (PLL) with a runaway detector. Similar to the PLL of FIG. 2, the PLL of FIG. 4 includes a phase-frequency (PFD) 110, a charge pump 125, a loop filter 130, a voltage-controlled oscillator (VCO) 140, and a divider 145. As shown in FIG. 4, a runaway detector 410 is coupled to the output of the VCO 140 to receive the output clock signal CKO 150. The runaway detector 410 also may be coupled to the output of the loop filter 130. Based on the output clock signal CKO 150, the runaway detector 410 outputs a discharge control signal DSCHG 420 which, after inversion by an inverter 440, may cause a component 430, which in one embodiment may be a transistor of a P-type transistor, coupled to both the output of the loop filter and the supply voltage, to raise the filtered control voltage VCTRL 135, thereby enabling the PLL to escape a runaway condition.

Figure 5:
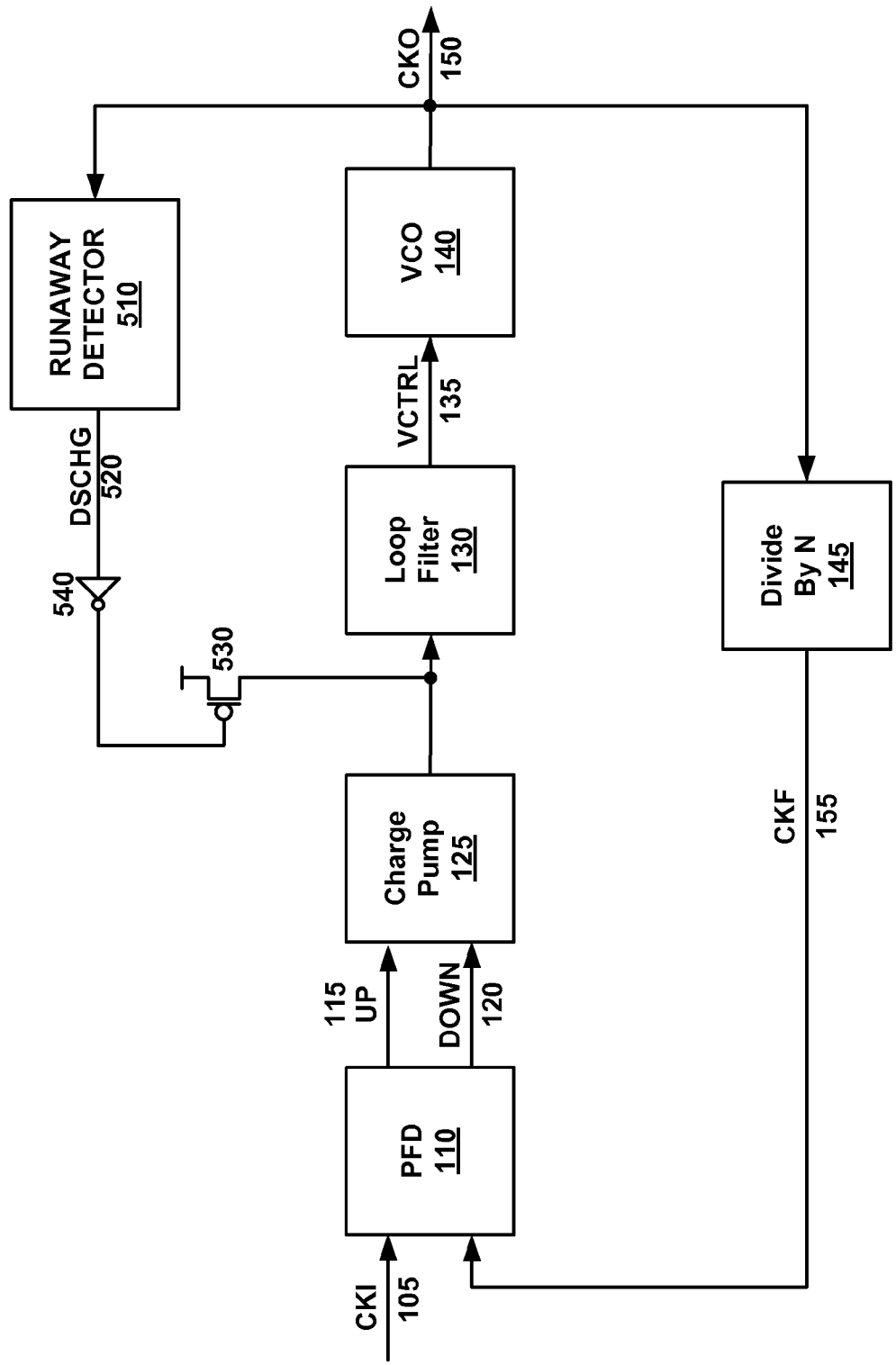
FIG. 5 illustrates a block diagram of another embodiment of a PLL with a runaway detector.

FIG. 5 illustrates a block diagram of another embodiment of a phase-locked loop (PLL) with a runaway detector. In FIG. 5, a runaway detector 510 may be coupled to the output of the charge pump VCP 160 rather than to the output of the loop filter 130. The runaway detector 510 otherwise operates in a manner similar to that of the runaway detector 410 in the FIG. 4 embodiment. The detector 510 may receive the output clock signal CKO 150 from the voltage-controlled oscillator (VCO) 140, and may output a discharge control signal DSCHG 520. A component 530, which may be a transistor or a P-type transistor, may receive the discharge control signal DSCHG 520 after inversion by an inverter 540. The component 530 may be coupled between the output of the charge pump VCP 160 and the supply voltage. The value of DSCHG 520 may vary depending on whether the output clock signal CKO 150 is below a certain predetermined frequency, indicating that the PLL may be in a runaway condition. If the detector 510 detects a runaway condition, the component 530 may increase the control voltage provided by the charge pump 125. This increase may result in a decrease of the frequency of the output clock signal CKO 150 provided by the VCO 140, thereby preventing the PLL from remaining in a runaway state. Coupling the component 530 and the runaway detector 510 to the output of the charge pump VCP 160 may enable any nose produced by the component 530 to be filtered by the loop filter 130.

Figure 6:
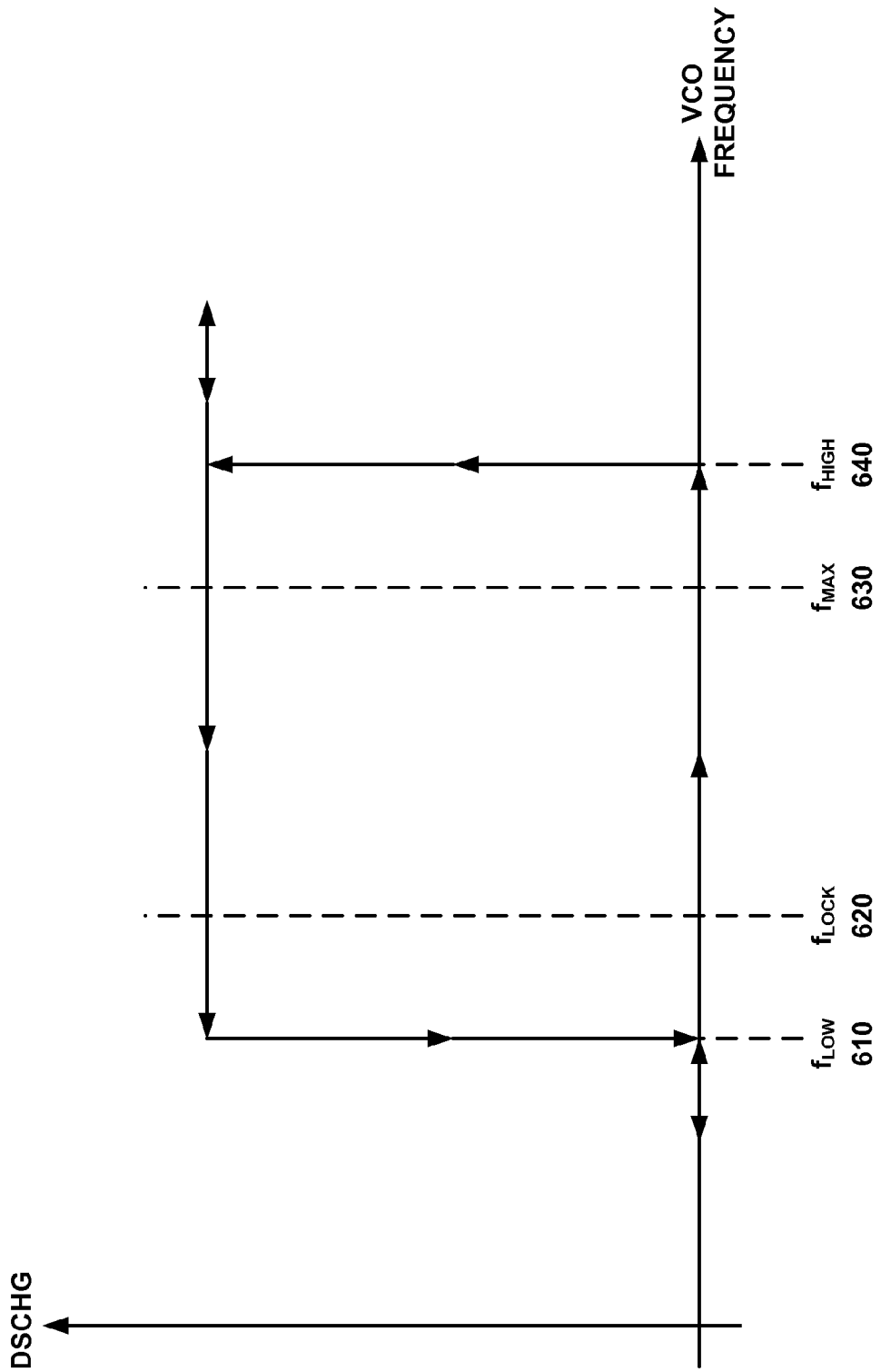
FIG. 6 is a graph illustrating the runaway detector transfer function.

FIG. 6. is a graph illustrating the runaway detector transfer function. In this embodiment, $f_{LOCK}$ 620 is the PLL lock frequency, $f_{MAX}$ 630 is the maximum allowed VCO frequency, $f_{HIGH}$ 640 is the runaway detector high-frequency trigger, and $f_{LOW}$ 610 is the runaway detector low-frequency trigger. The exact frequency values for the above-designated frequencies may vary depending on the desired specifications of the PLL. Generally, in one embodiment the ordering of the frequencies, regardless of the numerical values of the designated frequencies, may be such that $f_{LOW} < f_{MAX} < f_{HIGH}$. However, generally $f_{LOW}$ may be either above or below $f_{LOCK}$.

Generally, as the VCO 140 increases from a low frequency to its lock frequency, the runaway detector discharge control signal DSCHG may remain low. If the VCO frequency increases beyond its lock frequency (i.e. $f_{LOCK}$ 620) and maximum operating frequency (i.e. $f_{MAX}$ 630) toward $f_{HIGH}$ 640, the runaway detector is triggered and the value of the discharge control signal DSCHG provided by the runaway detector may change to high. As a result of the change in the DSCHG signal, the control voltage provided by the charge pump and the loop filter may decrease. This decrease may cause the VCO to decrease the frequency of the VCO output clock signal below $f_{HIGH}$ 640. Even though the VCO frequency may drop below $f_{HIGH}$ 640, the DSCHG discharge signal may remain high until the VCO frequency reaches $f_{LOW}$ 610. When the VCO output clock signal frequency reaches $f_{LOW}$ 610, the value of the DSCHG discharge signal returns to low. After the DSCHG signal goes low, the PLL one again may attempt to attain normal lock at $f_{LOCK}$ 620.

Figure 7:
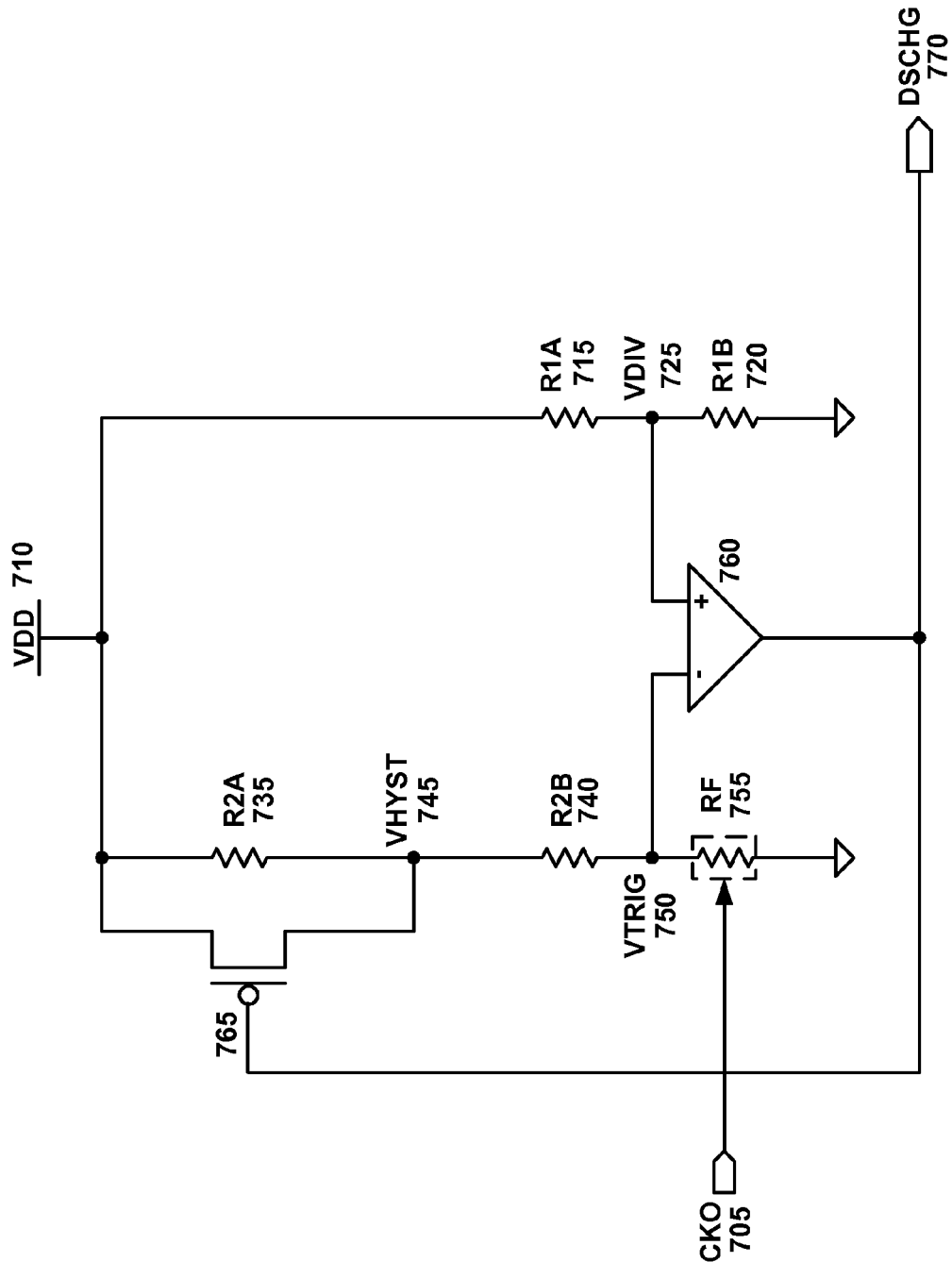
FIG. 7 is a circuit schematic of one embodiment of a runaway detector circuit in accordance with one aspect of the present invention.

FIG. 7 is a circuit schematic of one example of an embodiment of a runaway detector circuit. This embodiment may include a first circuit branch with multiple resistive components, a second circuit branch with multiple resistive components and a switching component such as a transistor (a P-type device 765 being shown in FIG. 7 as one example), and a comparator 760 to compare voltages from the two circuit branches and output the discharge control signal DSCHG 770. In FIG. 7, resistors R1A 715 and R1A 720 are included in the first circuit branch, connected in series, with resistor R1A 715 coupled to a voltage supply $V_{DD}$ 710 and resistor R1A 720. Resistor R1B 720 may be coupled in series to resistor R1A 715 and ground. Resistors R1A 715 and R1A 720 generally may serve as a voltage divider. In one embodiment, values for resistors R1A 715 and R1B 720 may be chosen such that supply voltage $V_{DD}$ 710 is divided substantially in half. For purposes of this embodiment, the voltage at this node may be called $V_{DIV}$ 725 and may be used as one of the two inputs to the comparator 760. Alternatively, the voltage at node $V_{DIV}$ 725 used as one of the two inputs to the comparator 760 may be supplied by an external source.

The second circuit branch also may include multiple resistive components, including a frequency-dependent resistor. Resistor R2A 735 and a switching component 765, such as a transistor (a P-type device being shown as an example), may be electrically connected in parallel and together may be electrically connected in series with resistor R2B 740 and frequency dependent resistor RF 755. An input (in this embodiment, the gate) of the switching component 765 also may be connected to the output of the comparator 760 such that when DSCHG is low, the switching component 765 is turned on. In this situation, the component 765 effectively shorts out resistor R2A 735. When DSCHG is high, the switching component 765 may turn off such that resistor R2A 735 is connected in series with resistor R2B 740. The frequency-dependent resistor RF 755, which receives the output clock signal CKO 705 as an input, may have a resistance inversely proportional to the CKO frequency. A voltage $V_{TRIG}$ 750 located at the node between resistors R2B 740 and RF 755 may be calculated and used as the second input to the comparator 760.

The comparator 760 may receive the $V_{DIV}$ 725 and $V_{TRIG}$ 750 voltages as inputs and may output the DSCHG 770 discharge control signal based on a comparison of the $V_{DIV}$ 752 and $V_{TRIG}$ 750 voltages. The resistance value of frequency-dependent resistor RF 755 may influence the value of $V_{TRIG}$ 750 and the comparator output signal DSCHG 770. When the frequency of the VCO output clock signal CKO 705 is below $f_{LOW}$, the resistance of RF 755 may be so high that $V_{TRIG}$ 750 is greater than $V_{DIV}$ 752, resulting in the comparator output signal DSCHG 770 being low. As the frequency of CKO 705 increases, the resistance of RF 755 may decrease, and correspondingly, $V_{TRIG}$ 750 may decrease as well. In one embodiment, the resistor values may be chosen such that when the CKO 705 frequency reaches $f_{HIGH}$, $V_{TRIG}$ 750 exactly equals $V_{DIV}$ 725, and the DSCHG 770 signal switches from low to high. As shown in FIG. 6, once the output signal DSCHG 770 is high, it may remain high until the VCO output clock signal CKO 705 decreases to $f_{LOW}$. When CKO 705 decreases to $f_{LOW}$, $V_{DIV}$ 725 may decrease to the point where $V_{DIV}$ 725 once again equals $V_{TRIG}$ 750. At this point, DSCHG 770 may switch from high to low. In this embodiment, the presence of the switching component 765 across R2A 735 causes the just-described effect.

Figure 8:
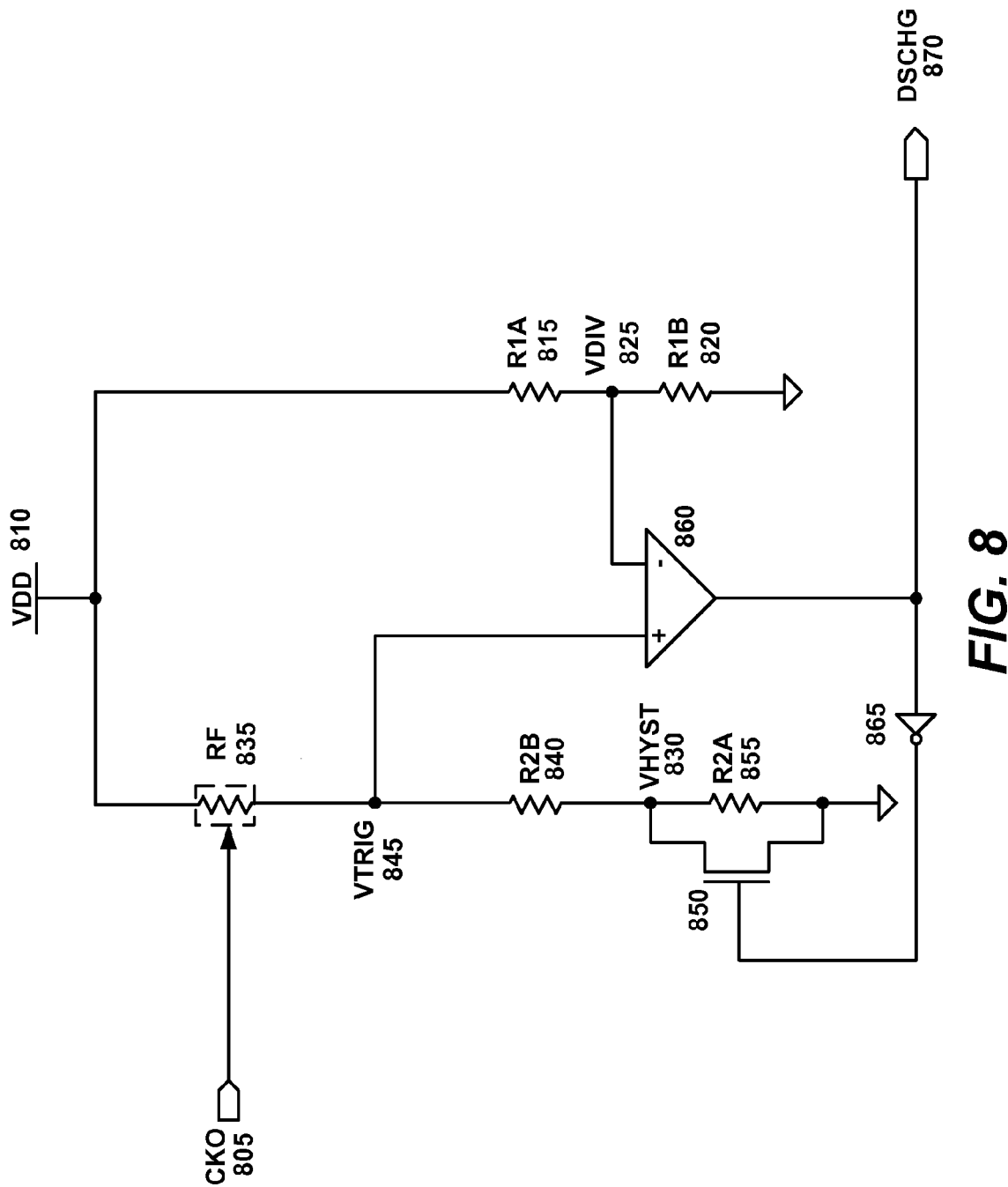
FIG. 8 is a circuit schematic of another embodiment of a runaway detector circuit.

FIG. 8 is a circuit schematic of another example of an embodiment of a runaway detector circuit. The embodiment may include a first circuit branch with multiple resistive components, a second circuit branch with multiple resistive components and a switching component such as a transistor (an N-type device 850 being shown in FIG. 8 as one example), and a comparator 860 to compare voltages from the two circuit branches and output the discharge control signal DSCHG 870. The first circuit branch may be configured similarly to the first circuit branch of the embodiment shown in FIG. 7, where resistors R1A 815 and R1B 820 serve as a voltage divider to divide the voltage from the voltage supply VDD 810 at the node $V_{DIV}$ 825 located between resistors R1A 815 and R1B 820. The voltage at node $V_{DIV}$ 825 may serve as one of the inputs to the comparator 860. Alternatively, the voltage $v_{DIV}$ 825 used as one of the inputs to the comparator 860 may be supplied by an external source.

The second circuit branch of this embodiment may have an alternate configuration, in which a frequency-dependent resistor RF 835, which receives the output clock signal CKO 805 as an input and has a resistance inversely proportional to the frequency of CKO 805, is electrically connected in series to a voltage supply VDD 810 and resistor R2B 840. Resistor R2B 840 may be connected in series with frequency-dependent resistor RF 835 and with the combination of resistor R2A 855 and switching component 850. Resistor R2A 855 may be electrically connected in parallel to the switching component 850, and the switching component 850 may be a transistor (an N-type device being shown as an example). Resistor R2A 855 and switching component 850 connected in parallel may be electrically connected to resistor R2B 840 and ground. An input (in this embodiment, the gate) of the switching component 850 also may be connected to the output of the comparator 860 via inverter 865 such that when DSCHG 870 is low, the switching component 850 is turned on. In this situation, the component 850 effectively shorts out resistor R2A 855. When DSCHG 870 is high, the switching component 850 may turn off such that resistor R2A 855 is connected in series with resistor R2B 840. A voltage $V_{TRIG}$ 845 located at the node between resistors RF 835 and R2B 845 may be calculated and used as the second input to the comparator 860.

The comparator 860 may receive the $V_{DIV}$ 825 and $V_{TRIG}$ 845 voltages as inputs and may output the DSCHG 870 discharge control signal based on a comparison of the $V_{DIV}$ 825 and $V_{TRIG}$ 845 voltages. The resistance value of frequency-dependent resistor RF 835 may influence the value of $V_{TRIG}$ 845 and the comparator output signal DSCHG 870. When the frequency of the VCO output clock signal CKO 805 is below $f_{LOW}$, the resistance of RF 835 may be so high that $V_{TRIG}$ 845 is less than $V_{DIV}$ 825, resulting in the comparator output signal DSCHG 870 being low. As the frequency of CKO 805 increases, the resistance of RF 835 may decrease, and correspondingly, $V_{TRIG}$ 845 may increase. In one embodiment, the resistor values may be chosen such that when the CKO 805 frequency reaches $f_{HIGH}$, $V_{TRIG}$ 845 exactly equals $V_{DIV}$ 825, and the DSCHG 870 signal switches from low to high. As shown in FIG. 6, once the output signal DSCHG 870 is high, it may remain high until the VCO output clock signal CKO 805 decreases to $f_{LOW}$. When CKO 805 decreases to $f_{LOW}$, $V_{TRIG}$ 845 may decrease to the point where $V_{TRIG}$ 845 once again equals $V_{DIV}$ 825. At this point, DSCHG 870 may switch from high to low. In this embodiment, the presence of the switching component 850 across R2A 855 causes the just-described hysteresis effect.

Figure 9:
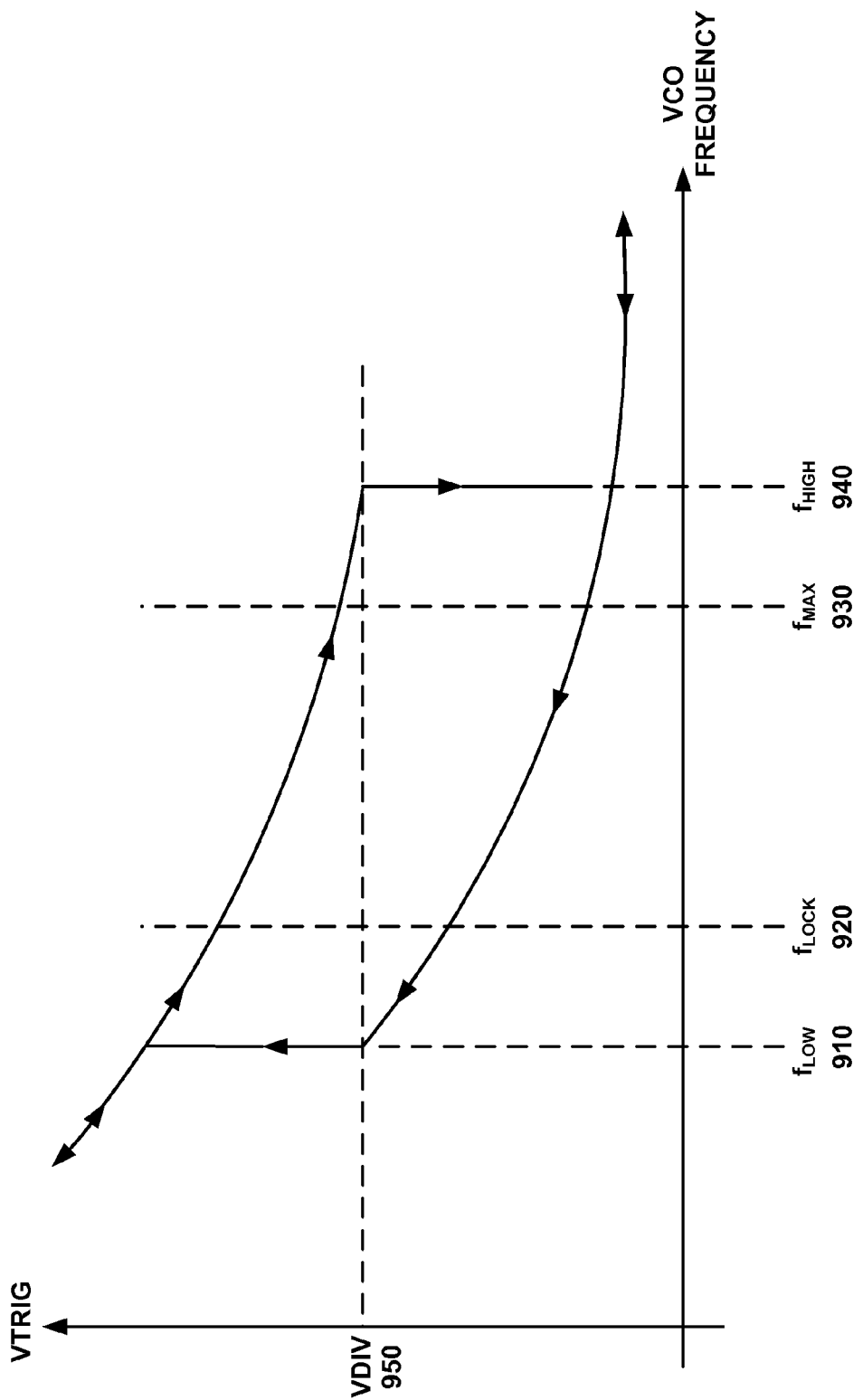
FIG. 9 is a graph illustrating the $V_{TRIG}$ transfer function, as described in the embodiment of FIG. 7.

FIG. 9 is a graph illustrating the $V_{TRIG}$ transfer function, as described in the embodiment of FIG. 7. When the VCO output clock frequency CKO 705 is below $f_{LOW}$ 910, the resistance of resistor RF 755, whose resistance, as discussed above, increases with decreasing CKO 705 frequency, is so high that $V_{TRIG}$ 750>$V_{DIV}$ 725, and the comparator output, which outputs the DSCHG 770 signal, is low. AS a result, the switching component 765 (a P-type device being shown in FIG. 7 as an example) connected across resistor R2A 735 is turned on. Resistor R2A 735 is effectively shorted out, leaving resistors R2B 740 and RF 755 to generate $V_{TRIG}$ 750. As the frequency of the output clock signal CKO 705 increases past $f_{LOCK}$ 920 and $f_{MAX}$ 930, the resistance of frequency-dependent resistor RF 755 decreases. Consequently, the value of $V_{TRIG}$ 750 also decreases. In one embodiment, the resistor values may be chosen such that when the CKO frequency reaches $f_{HIGH}$ 940, $V_{TRIG}$ 750 equals $V_{DIV}$ 725, and the DSCHG output 770 from the comparator 760 switches from low to high. When DSCHG 770 switches from low to high, the switching component 765 connected in parallel to resistor R2A 735 may turn off, thereby resulting in resistor R2A 735 being connected in series with resistor R2B 740. The addition of the resistance value of R2A 735 to the resistance values of R2B 740 and RF 755 may contribute to an immediate decrease in stepwise fashion in the value of $V_{TRIG}$ 750 to a value much lower than $V_{DIV}$ 725. However, the value of DSCHG 770 may not change on account of this decrease. Rather, DSCHG 770 may change from high to low only when the frequency of CKO 705 drops to $f_{LOW}$ 910. At this point, $V_{TRIG}$ 750 may equal $V_{DIV}$ 725 again. When DSCHG 770 switches to low, the switching component 765 connected in parallel to resistor R2A 735 may turn back on, thus effectively shorting out resistor R2A 735 and causing $V_{TRIG}$ 750 to increase in stepwise fashion to a value above $V_{DIV}$ 725. In this embodiment, the presence of the switching component 765 across R2A 735 causes the just-described hysteresis effect.

Figure 10:
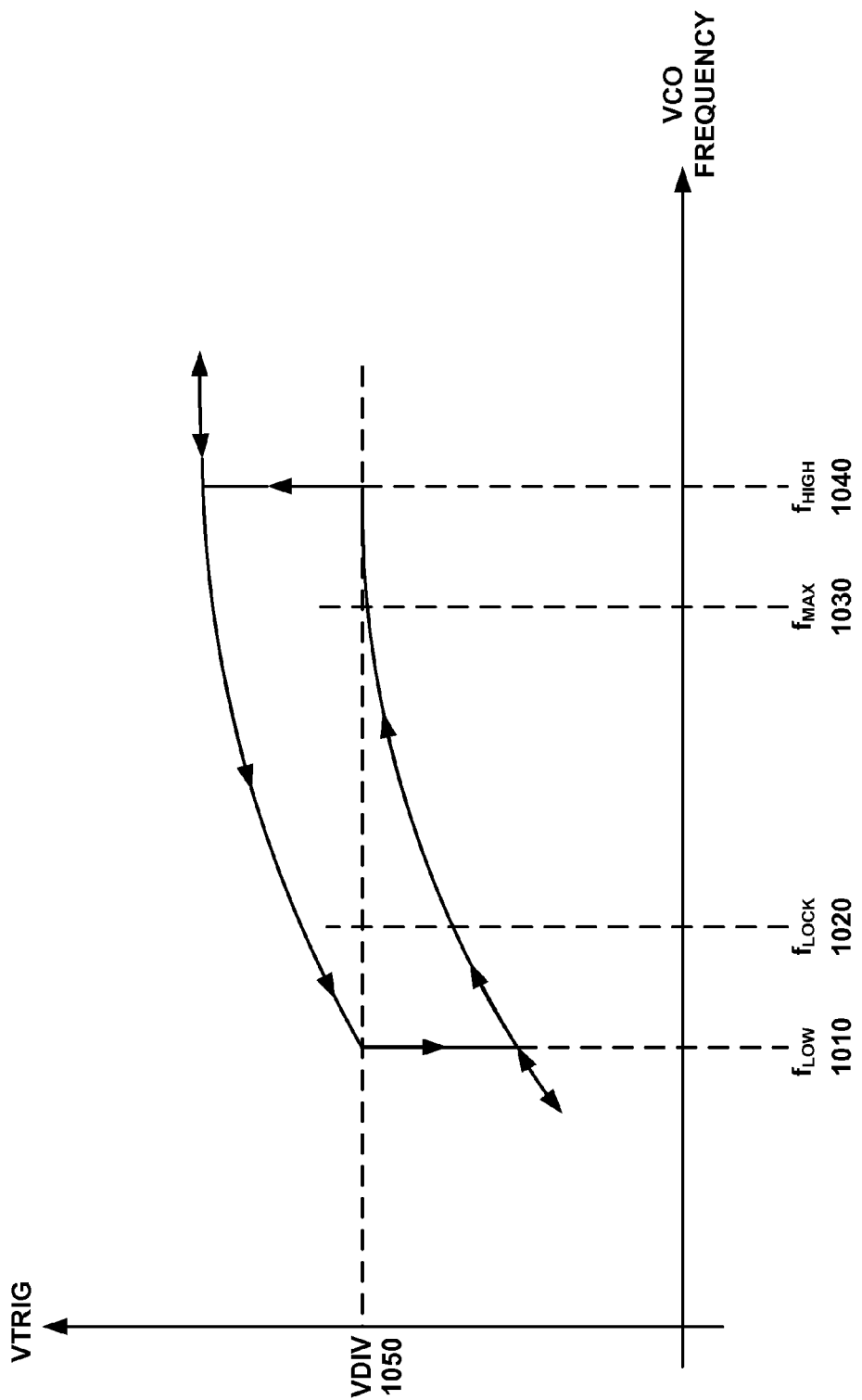
FIG. 10 is a graph illustrating the $V_{TRIG}$ transfer function, as described in the embodiment of FIG. 8.

FIG. 10 is a graph illustrating the $V_{TRIG}$ transfer function, as described in the embodiment of FIG. 8. When the VCO output clock frequency CKO 805 is below $f_{LOW}$ 1010, the resistance of resistor RF 835, whose resistance, as discussed above, increases with decreasing CKO 805 frequency, is so high that $V_{TRIG}$ 845<$V_{DIV}$ 825, and the comparator output, which outputs the DSCHG 870 signal, is low. As a result, the switching component 850 (an N type device being shown in FIG. 8 as an example) connected across resistor R2A 855 is turned on. Resistor R2A 855 is effectively shorted out, leaving resistors R2B 840 and RF 835 to generate $V_{TRIG}$ 845. As the frequency of the output clock signal CKO 805 increases past $f_{LOCk}$ 1020 and $f_{MAX}$ 1030, the resistance of frequency-dependent resistor RF 835 decreases. Consequently, the value of $V_{TRIG}$ 845 increases. In one embodiment, the resistor values may be chosen such that when the CKO frequency reaches $f_{HIGH}$ 1040, $V_{TRIG}$ 845 equals $V_{DIV}$ 825, and the DSCHG output 870 from the comparator 860 switches from low to high. When DSCHG 870 switches from low to high, the switching component 850 connected in parallel to resistor R2A 855 may turn off, thereby resulting in resistor R2A 855 being connected in series with resistor R2B 840. The addition of the resistance value of R2A 855 to the resistance values of R2B 840 and RF 835 may contribute to an immediate increase in stepwise fashion in the value of $V_{TRIG}$ 845 to a value much higher than $V_{DIV}$ 825. However, the value of DSCHG 870 may not change on account of this increase. Rather, DSCHG 870 may change from high to low only when the frequency of CKO 805 drops to $f_{LOW}$ 1010. At this point, $V_{TRIG}$ 845 may equal $V_{DIV}$ 825 again. When DSCHG 870 switches to low, the switching component 850 connected in parallel to resistor R2A 855 may turn back on, thus effectively shorting out resistor R2A 855 and causing $V_{TRIG}$ 845 to decrease in stepwise fashion to a value below $V_{DIV}$ 825. In this embodiment, the presence of the switching component 850 across R2A 855 causes the just-described hysteresis effect.

Figures 11A, 11B:
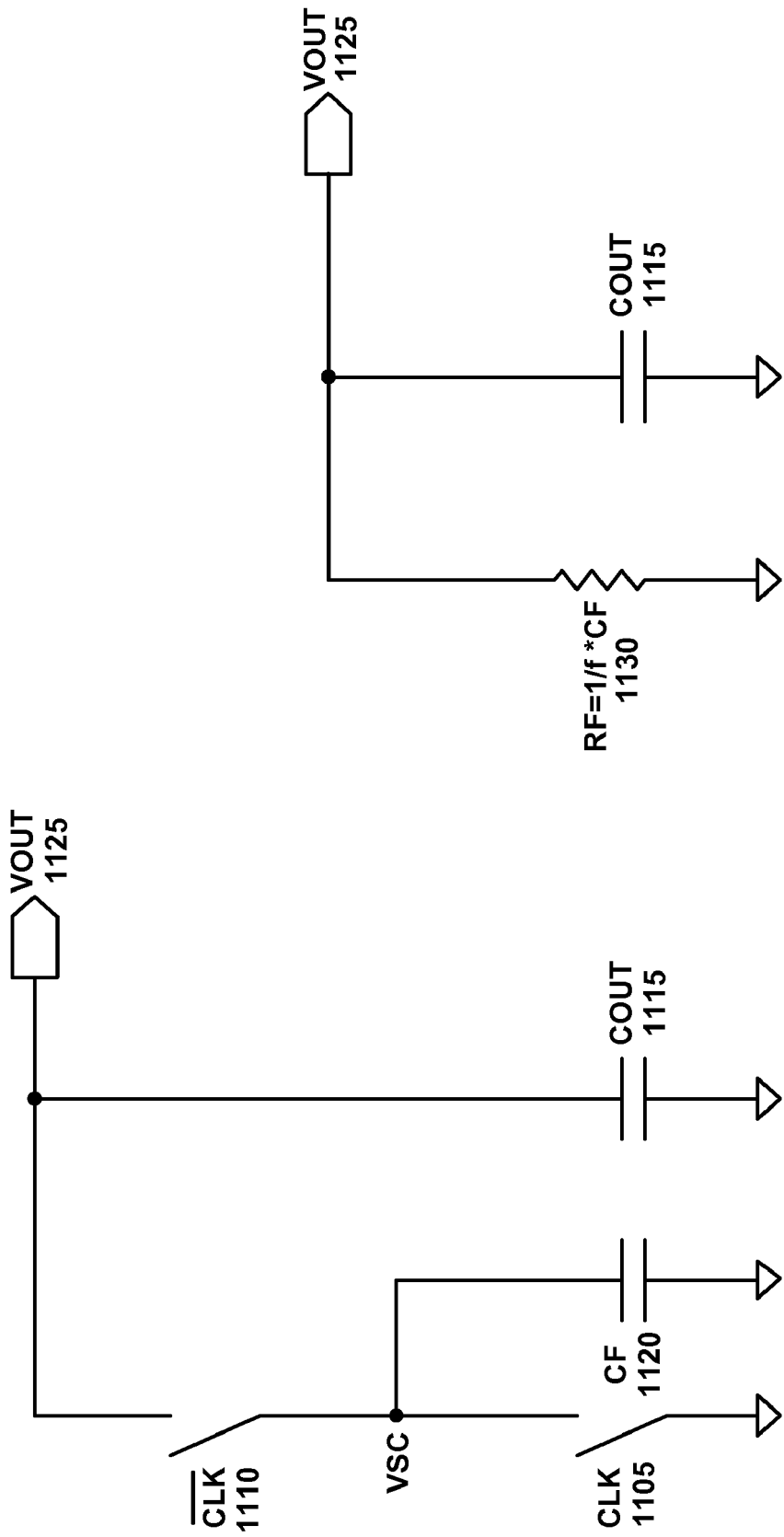
FIG. 11a is a circuit schematic of one embodiment of a component of a runaway detector circuit in accordance with one aspect of the present invention.
FIG. 11b is a circuit schematic of another embodiment of a component of a runaway detector circuit in accordance with one aspect of the present invention.

FIG. 11a is a circuit schematic of one embodiment of a component of a runaway detector. In this embodiment, the resistor RF 755 may be implemented as a switched capacitor. The switched capacitor embodiment may include multiple capacitors. In the embodiment shown, the switched capacitor implementation includes two switches and two capacitors, COUT 1115 and CF 1120. When CLK 1105 is low, capacitor CF 1120 may be shorted to capacitor COUT 1115, while when CLK 1105 is high, capacitor CF 1120 may be shorted to ground. Accordingly, the equivalence of frequency-dependent resistor RF 1155 to the switched capacitor embodiment may be demonstrated as follows; For each CLK clock cycle, a packet of charge equal to CF*VOUT may be transferred from capacitor COUT 1115 to ground. For each charge packet transferred from VOUT 1125 to ground, VOUT 1125 may decrease, yielding a gradual discharge of VOUT 1125 to 0 V.

The discharge characteristic of VOUT 1125 may be derived by examining its value on consecutive clocks. From this examination, VOUT's value for any clock signal may be expressed generally. For example, the value of VOUT 1125 when CLK 1105 is low in clock period 0 may be designated "VOUT(0)." When CLK 1105 goes high at the start of the following clock period, clock period 1, a charge equal to CF*VOUT(0) may be transferred to ground, leaving a charge of COUT*VOUT(0) on capacitor COUT. When CLK 1105 goes low in clock period 1, CF 1120 may be connected to COUT 1115, and the charge on COUT 1115 may be redistributed between CF 1120 and COUT 1115. Consequently, the value of VOUT 1125 in clock period 1, designated VOUT(1), may be expressed as:

$$VOUT(1)=[COUT*VOUT(0)]/[COUT+CF]=\alpha*VOUT(0),$$

where $\alpha \equiv COUT/(COUT+CF)$. Similarly, the value of VOUT 1125 in clock period 2 may be express as:

$$VOUT(2)=[COUT*VOUT(1)]/[COUT+CF]=\alpha*VOUT(1)=\alpha^2*VOUT(0).$$

Thus, for any clock period n, VOUT 1125 may be calculated using, $$VOUT(n)=[COUT*VOUT(n-1)]/[COUT+CF]=\alpha*VOUT(n-1)=\alpha^2*VOUT(n-2)=\ldots=\alpha^n*VOUT(0).$$

Given that $\alpha \equiv COUT/(COUT+CF)$ inherently is less than 1, the above equation demonstrates that VOUT 1125 decreases (i.e. discharges) for each clock cycle. An alternative way of writing the above equation is $$VOUT(n)=\alpha^n*VOUT(0)=e^{n*\ln \alpha}*VOUT(0).$$

Substituting n≈t*f, where f is the CLK 1105 frequency and t is the elapsed time, the equation becomes $$VOUT(n)=e^{n*\ln \alpha}*VOUT(0)=e^{1*f*\ln \alpha}*VOUT(0)=e^{-1/T}*VOUT(0),$$

where time constant T is identical to:

$$T=-1/(f*\ln \alpha)=-1/[f*\ln(COUT/(COUT+CF))]=-1/[f*\ln(1/(1+(CF/COUT)))]=1/[f*\ln(1+(CF/COUT))].$$

Generally, the capacitance of COUT 1115 may be much greater than CF 1120, so the time constant T may simplify to:

$$T=1/[f*\ln(1+(CF/COUT))]\approx COUT/(f*CF)=RF*COUT,$$

where $RF \equiv 1/(f*CF)$, i.e., the value of RF is inversely proportional to clock frequency.

FIG. 11b is a circuit schematic of one embodiment of a component of a runaway detector circuit. This embodiment illustrates the equivalence of the resistor RF 1130 to the switched-capacitor circuit of FIG. 11a. Based on the discussion of FIG. 7, the resistor RF 1130 may be shown to have a resistance inversely proportional to the CLK 1105 frequency f. The time constant T created by having capacitor COUT 1115 connected in parallel to resistor RF 1130 may not be needed in the runaway detector, but exists as a by-product of the switched-capacitor implementation of resistor RF 1130. This time constant may not interfere with correct operation of the runaway detector so long as the time constant is not excessively large.

Figure 12:
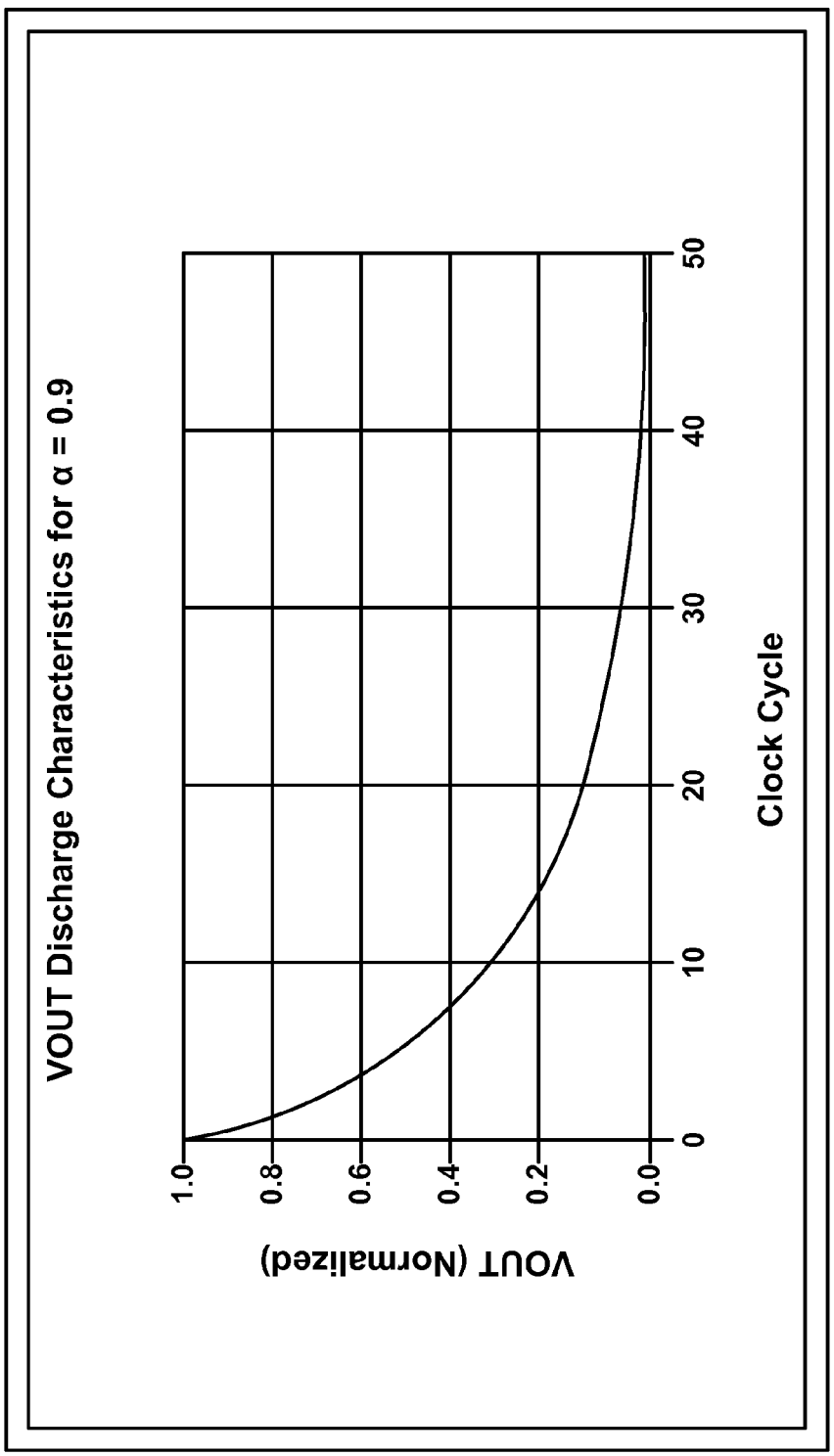
FIG. 12 is a graph generally illustrating the discharge of VOUT for a given number of clock cycles.

FIG. 12 is a graph generally illustrating the discharge of VOUT 1125 for a given number of clock cycles. As discussed above, the equation VOUT(n)=α$^n$*VOUT(0) describes the value of VOUT 1125 for a given clock cycle. Because α is generally less than 1.0, VOUT 1125 decreases generally in an exponential fashion, and the rate at which VOUT 1125 decreases over time may depend on the value of α. In this example, the graph depicts the decrease of VOUT 1125 over time for α=0.9.

Figure 13:
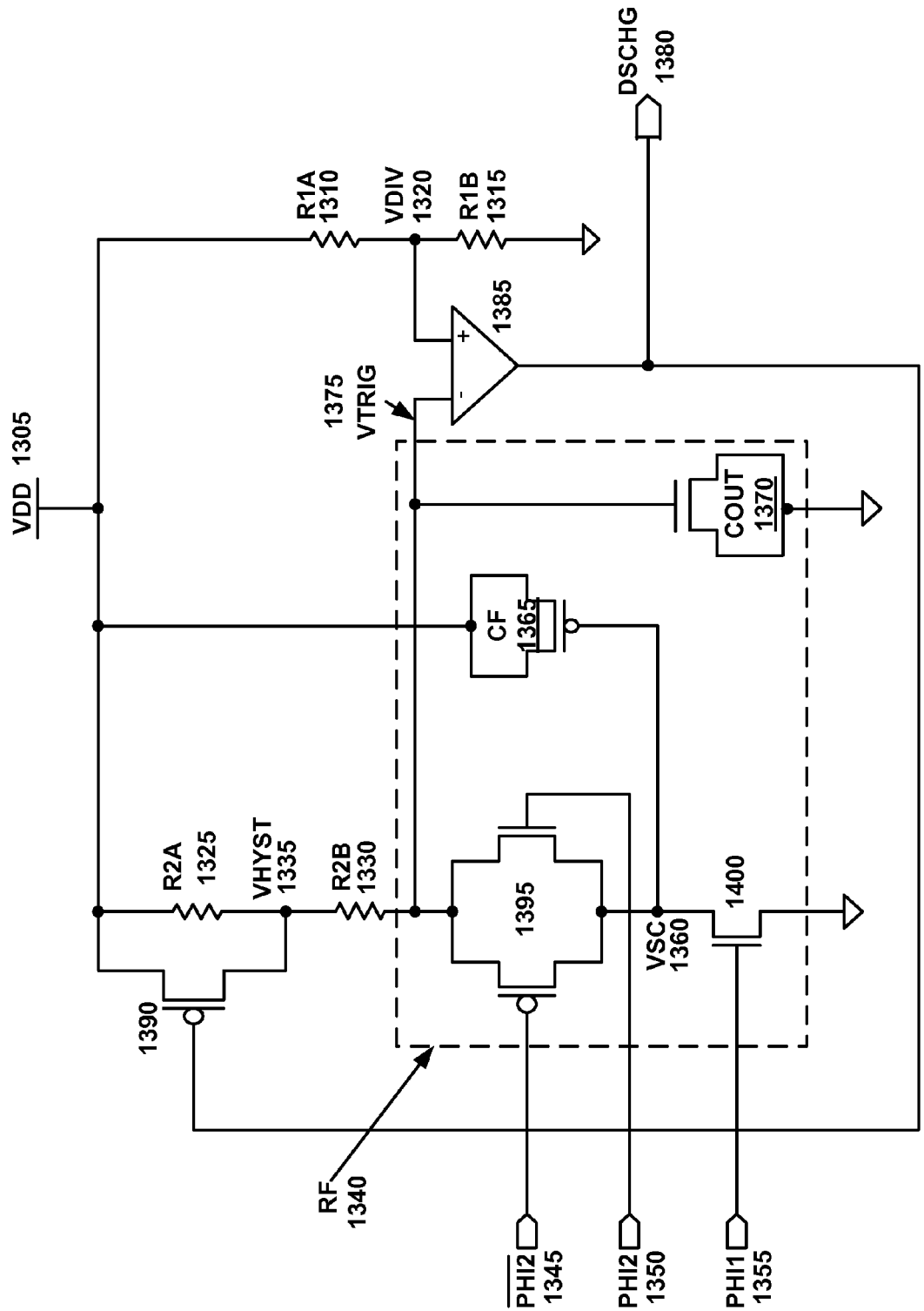
FIG. 13 is a circuit schematic of one embodiment of a runaway detector circuit in accordance with one aspect of the present invention.

FIG. 13 is a circuit schematic of one example of an embodiment of a runaway detector circuit. In this embodiment, the resistor RF 1340 is implemented as a switched capacitor. Similar to FIG. 7, this embodiment of a runaway detector circuit has two circuit branches, branches, each providing a voltage input to a comparator 1385, which outputs a discharge control signal DSCHG 1380 based on the comparison of the two input voltages. In this embodiment, the first circuit branch may have multiple resistive elements, shown by resistors R1A 1310 and R1B 1315. These two resistors may serve as a voltage divider for the supply voltage $V_{DD}$ 1305. The resulting voltage $V_{DIV}$ 1320 at the node between resistors R1A 1310 and R1B 1315 may be input to the comparator 1385. The second circuit branch also may have multiple resistive elements, shown by resistors R2A 1325 and R2B 1330, as well as a P-type device 1390, such as a transistor, connected in parallel to resistor R2A 1325 and coupled to the output of the comparator 1385. Resistors R2A 1325 and R2B 1330 may be connected in series with the switched-capacitor implementation of the resistor RF 1340. The voltage $V_{TRIG}$ 1375 existing at the node between resistors R2B 1330 and RF 1340 may serve as the input to the comparator 1385 and may change depending on the variable resistance of the frequency-dependent resistor RF 1340.

In this example, the switched-capacitor implementation of the resistor RF 1340 may include a first switching component (an N-type device 1370 being shown as an example) representing the capacitor COUT 1115 of FIG. 11, a second switching component (a P-type device 1365 being shown as an example) representing the capacitor CF 1120 of FIG. 11, and MOS devices 1395 and 1400 representing the switches 1110 and 1105 of FIG. 11 respectively. The capacitor COUT 1370 may be implemented as an N-type device whose source and drain are connected to ground and whose gate may be connected to the RF node at $V_{TRIG}$ 1375. The capacitor CF 1365 may be implemented as a P-type device whose source and drain are connected to the supply voltage $V_{DD}$ 1305 and whose gate may be connected to node $V_{SC}$ 1360. The switches 1110 and 1105 of FIG. 11 may be implemented as MOS devices 1395 and 1400, respectively, which are driven by non-overlapping clock phases derived from the VCO output clock signal CKO. Generally, PHI 1355 never may be active simultaneously with PHI2 1350 or PHI2' 1345, nor may PHI2 1350 and PHI2' 1345 ever be active simultaneously with PHI1 1355. As a result, the switches 1395 and 1400 may not conduct simultaneously, thus preventing the occurrence of a short circuit from node $V_{TRIG}$ 1375 to ground.

Figure 14:
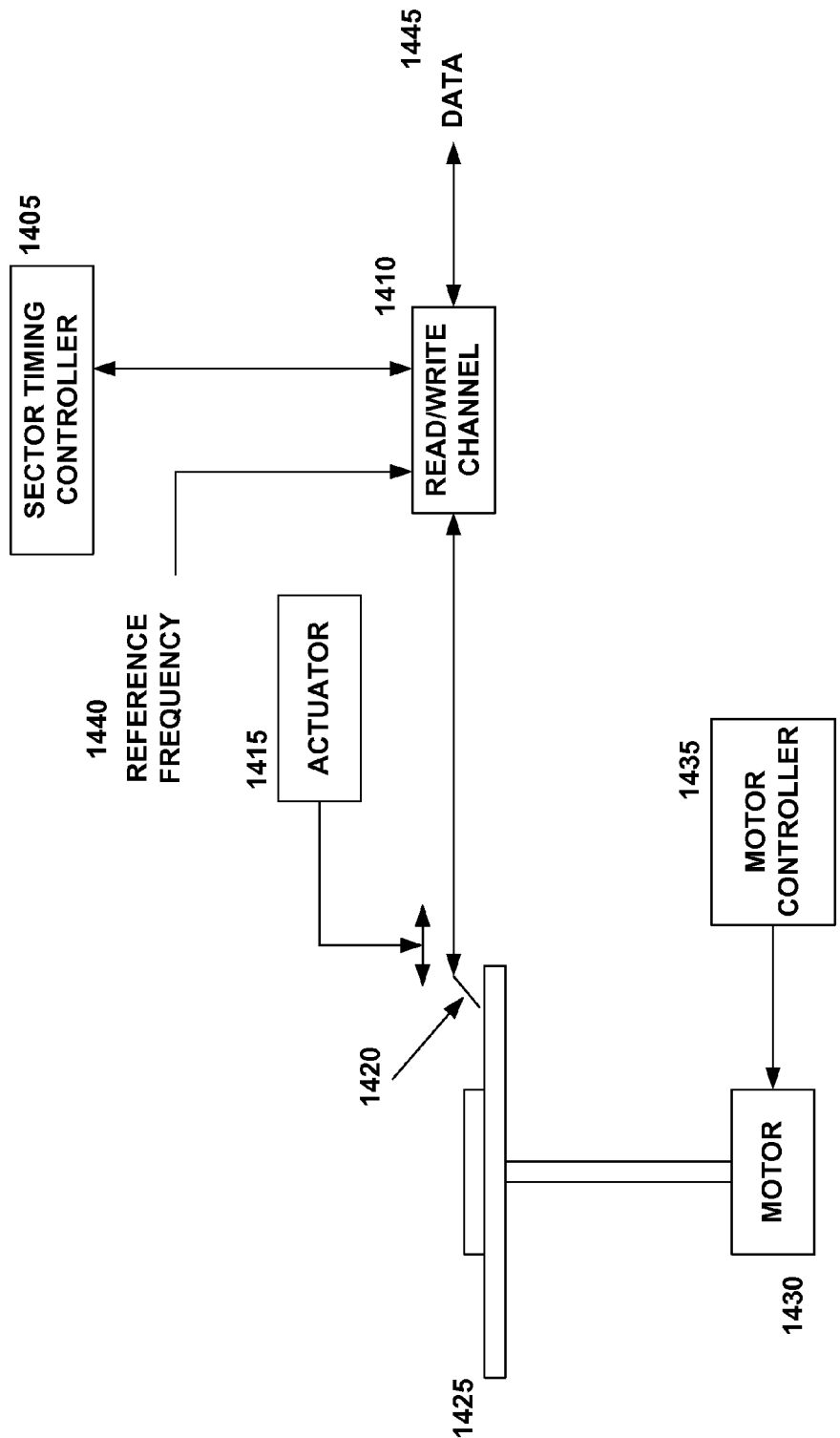
FIG. 14 is a block diagram of a conventional hard disk drive system showing the major components.

FIG. 14 is a block diagram of a conventional hard disk drive system showing the major components. The hard disk drive system comprises a disk having a magnetic disk 1425. The motor 1430 spins the disk at a constant speed and under control of the motor control 1435. Data 1445 passes through a read/write channel 1410 to a transducing head 1420. The servo actuator 1415 positions the transducing head 1420 over the proper data track, and data is transmitted to or from the read/write channel 1410. A reference frequency 1440 provides timing signals to the read/write channel 1410. As data is read by the transducing head 1420 and processed by the read/write channel 1410, embodiments of the invention described above which may be incorporated in the read/write channel may engage in clock recovery associated with the reading of data. Skilled practitioners in the art will recognize that other configurations are possible.

Figure 15:
FIG. 15 is a simplified block diagram of a transceiver.

FIG. 15 is a simplified block diagram of a transceiver. The transceiver may include a receiver 1510 which receives an input data signal having a first frequency. Depending on the application of the transceiver, the receiver 1510 may receive the input signal via, among other things, an antenna, an Ethernet network or other type of network, or telephone lines. The signal may be manipulated by one or more filters, amplifiers, and mixers to isolate and amplify a desired frequency bandwidth of the signal. A data control unit 1520 may further process the frequency of the data signal by filtering, amplifying, and mixing the signal. In addition to circuit elements such as filters, mixers and amplifiers, the data control unit 1520 may include embodiments of the invention described above to synchronize and adjust the frequency of the data signal to match a transmission frequency. A transmitter 1530 may further process the data signal before transmission of the signal. If the input data signal is an analog signal, the transmitter 1530 may convert the analog signal to a digital signal. Skilled practitioners in the art will recognize other transceiver configurations are possible and that embodiments of the invention described above may be applied to any transceiver which receives a signal of a first frequency and transmits a signal of a second frequency.

Embodiments of the invention described above may be used in or incorporated into a multitude of fields and devices, including but not limited to, telecommunications, storage devices, microprocessors, radio applications, and other electronic applications where it is desirable to prevent or exit from a runaway condition. For example, embodiments of the invention described above may be used for clock recovery in high-speed data streams, such as in read channels in disk drives. Embodiments of the invention described above also may be used in transceivers or other devices in which an input signal of a first frequency is received and an output signal of a second frequency is transmitted. Embodiments of the invention described above also may be used to demodulate Frequency Modulated (FM) and Amplitude Modulated (AM) signals. Embodiments of the invention described above also may serve as clock generators and/or multipliers in microprocessors or other processing devices. In addition to these exemplary embodiments, those skilled in the art will recognize that numerous applications of the above-described embodiments are possible, and that disclosure of the just-described applications does not limit the invention to those applications. Rather, all suitable applications fall within the scope of the invention.

Therefore, the foregoing is illustrative only of the principles of the invention. Further, those skilled in the art will recognize that numerous modifications and changes are possible, the disclosure of the just-described embodiments does not limit the invention to the exact construction and operation shown, and accordingly, all suitable modifications and equivalents fall within the scope of the invention.

What is claimed is:

1. A circuit, comprising:
   a phase-locked loop, comprising:
   a loop filter, providing a filtered control voltage; and
   a voltage-controlled oscillator, coupled to said loop filter, to receive said filtered control voltage and provide an output clock signal;

said circuit further comprising:
  a runaway detector, coupled to said phase-locked loop, to provide a discharge control signal for adjusting said filtered control voltage in response to a predetermined condition of said phase-locked loop, said runaway detector includes a comparator to compare first and second input voltages and to output said discharge control signal based on said comparison, said first input voltage being based on a fixed voltage and said second input voltage being based on said output clock signal;
  wherein said runaway detector adjusts said filtered control voltage when said predetermined condition exists, thereby enabling said phase-locked loop to return to a lock condition; and
  wherein said runaway detector further includes:
    a first circuit branch, including a first plurality of resistors coupled to said fixed voltage and a ground, for generating said first input voltage; and
    a second circuit branch, including a second plurality of resistors, coupled to said fixed voltage and said ground, for generating said second input voltage;
      wherein, in response to a first state of said comparator, said runaway detector outputs a first signal to adjust said filtered control voltage, and in response to a second state of said comparator, said runaway detector outputs a second signal which allows said filtered control voltage to pass to said voltage-controlled oscillator.

2. The circuit of claim 1, wherein said second plurality of resistors includes a frequency-dependent resistor, said frequency-dependent resistor being responsive to said output clock signal and having a resistance inversely proportional to said output clock signal.

3. The circuit of claim 2, wherein said second plurality of resistors, including said frequency-dependent resistor, are electrically connected in series, said second plurality of resistors including a third resistor electrically connected to said fixed voltage and a fourth resistor, said fourth resistor electrically connected to said third resistor and said frequency-dependent resistor, and said frequency-dependent resistor electrically connected to said fourth resistor and said ground.

4. The circuit of claim 3, wherein said second circuit branch further includes a transistor, electrically connected in parallel to said third resistor, a gate of said transistor being electrically connected to the output of said comparator.

5. The circuit of claim 3, wherein said second input voltage is the voltage at a node between said fourth resistor and said frequency-dependent resistor.

6. The circuit of claim 2, wherein said frequency-dependent resistor is implemented using a switched capacitor circuit having at least one capacitor.

7. The circuit of claim 6, wherein said at least one capacitor of said switched capacitor circuit is implemented using a transistor.

8. The circuit of claim 2, wherein said second plurality of resistors, including said frequency-dependent resistor, are electrically connected in series, said second plurality of resistors including said frequency-dependent resistor electrically connected to said fixed voltage and a third resistor, said third resistor electrically connected to said frequency-dependent resistor and a fourth resistor, and said fourth resistor electrically connected to said third resistor and said ground.

9. The circuit of claim 8, wherein said second circuit branch further includes a transistor, electrically connected in parallel to said fourth resistor, a gate of said transistor being electrically connected to the output of said comparator.

10. The circuit of claim 8, wherein said second input voltage is the voltage at a node between said third and fourth resistors.

11. The circuit of claim 1, further comprising a switching component, connected to an output of said runaway detector and to said phase-locked loop, to selectively adjust or pass said filtered control voltage responsive to said first and second states, respectively.

12. The circuit of claim 11, wherein said switching component comprises a transistor.

13. The circuit of claim 1, wherein said first plurality of resistors are electrically connected in series, said first plurality of resistors including a first resistor electrically connected to said fixed voltage and a second resistor, and said second resistor electrically connected to said first resistor and said ground.

14. The circuit of claim 13, wherein said first input voltage is the voltage at a node between said first and second resistors.

15. A circuit, comprising:
  loop means, comprising:
    filter means for providing a filtered control voltage; and
    signal generating means, coupled to said filter means, for generating an output clock signal based on said filtered control voltage;
  said circuit further comprising:
    voltage adjusting means, coupled to said loop means, for providing a discharge control signal to adjust said filtered control voltage in response to a predetermined condition of said loop means, said voltage adjusting means including comparing means for comparing first and second input voltages and for outputting said discharge control signal based on said comparison, said first input voltage being based on a fixed voltage and said second input voltage being based on said output clock signal;
    wherein said voltage adjusting means adjusts said filtered control voltage when said predetermined condition exists, thereby enabling said loop means to return to a lock condition; and
    wherein said voltage adjusting means further includes:
      means for generating said first input voltage comprising a first plurality of resistors coupled to said fixed voltage and a ground; and
      means for generating said second input voltage comprising a second plurality of resistors coupled to said fixed voltage and said ground;
        wherein, in response to a first state of said comparing means, said voltage adjusting means outputs a first signal to reduce said filtered control voltage, and in response to a second state of said comparing means, said voltage adjusting means outputs a second signal to allow said filtered control voltage to pass to said signal generating means.

16. The circuit of claim 15, wherein said second plurality of resistors includes a frequency-dependent resistor, said frequency-dependent resistor being responsive to said output clock signal and having a resistance inversely proportional to said output clock signal.

17. The circuit of claim 16, wherein said second plurality of resistors, including said frequency-dependent resistor, are electrically connected in series, said second plurality of resistors including a third resistor electrically connected to said fixed voltage and a fourth resistor, said fourth resistor electrically connected to said third resistor and said frequency-dependent resistor, and said frequency-dependent resistor electrically connected to said fourth resistor and said ground.

18. The circuit of claim 17, wherein said means for generating said second input voltage includes a transistor, electrically connected in parallel to said third resistor, a gate of said transistor being electrically connected to the output of said comparing means.

19. The circuit of claim 17, wherein said second input voltage is the voltage at a node between said fourth resistor and said frequency-dependent resistor.

20. The circuit of claim 16, wherein said frequency-dependent resistor is implemented using a switched capacitor circuit having at least one capacitor.

21. The circuit of claim 20, wherein said at least one capacitor of said switched capacitor circuit is implemented using a transistor.

22. The circuit of claim 16, wherein said second plurality of resistors, including said frequency-dependent resistor, are electrically connected in series, said second plurality of resistors including said frequency-dependent resistor electrically connected to said fixed voltage and a third resistor, said third resistor electrically connected to said frequency-dependent resistor and a fourth resistor, and said fourth resistor electrically connected to said third resistor and said ground.

23. The circuit of claim 22, wherein said means for generating said second input voltage further comprises a transistor, electrically connected in parallel to said fourth resistor, a gate of said transistor being electrically connected to the output of said comparing means.

24. The circuit of claim of claim 22, wherein said second input voltage is the voltage at a node between said frequency-dependent and third resistors.

25. The circuit of claim 15, further comprising switching means, connected to an output of said voltage adjusting means and to said phase-locked loop, for selectively reducing or passing said filtered control voltage responsive to said first and second states, respectively.

26. The circuit of claim 25, wherein said switching means comprises a transistor.

27. The circuit of claim 15, wherein said first plurality of resistors are electrically connected in series, said first plurality of resistors including a first resistor electrically connected to said fixed voltage and a second resistor, and said second resistor electrically connected to said first resistor and said ground.

28. The circuit of claim 27, wherein said first input voltage is the voltage at a node between said first and second resistors.

* * * * *